(12) United States Patent
Lin

(10) Patent No.: US 10,315,078 B2
(45) Date of Patent: Jun. 11, 2019

(54) GOLF BALL FABRICATION METHOD

(71) Applicant: Chromax Golf Company, Boulder, CO (US)

(72) Inventor: Stuart Lin, Kaohsiung (TW)

(73) Assignee: Chromax Golf Company

( * ) Notice: Subject to any disclaimer, the term of this patent is extended or adjusted under 35 U.S.C. 154(b) by 476 days.

(21) Appl. No.: 14/990,485

(22) Filed: Jan. 7, 2016

(65) Prior Publication Data

US 2016/0114224 A1    Apr. 28, 2016

Related U.S. Application Data

(63) Continuation-in-part of application No. 14/027,745, filed on Sep. 16, 2013, which is a continuation-in-part
(Continued)

(30) Foreign Application Priority Data

Jul. 7, 2006    (JP) .................. 2006-005465

(51) Int. Cl.
| B29L 31/54 | (2006.01) |
| B29C 45/14 | (2006.01) |
| A63B 45/02 | (2006.01) |
| A63B 43/00 | (2006.01) |
| A63B 37/12 | (2006.01) |
| A63B 37/00 | (2006.01) |
| A63B 45/00 | (2006.01) |
| C23C 18/31 | (2006.01) |
| B29K 705/00 | (2006.01) |

(Continued)

(52) U.S. Cl.
CPC .......... *A63B 45/00* (2013.01); *A63B 37/0003* (2013.01); *A63B 37/004* (2013.01); *A63B 37/0022* (2013.01); *A63B 37/0024* (2013.01); *A63B 37/0039* (2013.01); *A63B 37/0045* (2013.01); *A63B 37/0076* (2013.01); *A63B 45/02* (2013.01); *B29C 37/0025* (2013.01); *B29C 45/14688* (2013.01); *B29C 45/14819* (2013.01); *C23C 14/34* (2013.01); *C23C 18/31* (2013.01); *A63B 37/0075* (2013.01); *A63B 37/12* (2013.01); *A63B 43/008* (2013.01); *B29K 2705/00* (2013.01); *B29L 2031/546* (2013.01)

(58) Field of Classification Search
None
See application file for complete search history.

(56) References Cited

U.S. PATENT DOCUMENTS 2,861,810 A * 11/1958 Veatch ............... A63B 24/0021
                                                                  40/327
4,169,599 A    10/1979 Fujio
(Continued)

Primary Examiner — John J Brayton
(74) Attorney, Agent, or Firm — Muncy, Geissler, Olds & Lowe, P.C.

(57) ABSTRACT

A golf ball fabrication method comprises Step a: providing a core; Step b: spraying a thin resin film on the surface of the core to form a conductive layer; Step c: vacuum-electroplating the surface of the core to form a glossy thin metallic film functioning as a reflective layer; and Step d: encapsulating the glossy thin metallic film with a transparent resin layer in an injection-molding technology to form a transparent outer layer of the golf ball. The method can fabricate in a simple way a golf ball having a superior reflective effect and a long service life simultaneously.

12 Claims, 9 Drawing Sheets

Related U.S. Application Data of application No. 12/535,312, filed on Aug. 4, 2009, now abandoned, which is a continuation-in-part of application No. 11/529,526, filed on Sep. 29, 2006, now abandoned.

(51) Int. Cl.
*B29C 37/00* (2006.01)
*C23C 14/34* (2006.01)

(56) References Cited

U.S. PATENT DOCUMENTS

| | | | | |
|---|---|---|---|---|
| 4,650,193 A | * | 3/1987 | Molitor | A63B 37/0003 264/265 |
| 4,798,386 A | * | 1/1989 | Berard | A63B 37/0003 264/239 |
| 5,427,378 A | | 6/1995 | Murphy | |
| 5,494,291 A | | 2/1996 | Kennedy | |
| 5,651,741 A | | 7/1997 | Masutani et al. | |
| 6,066,055 A | * | 5/2000 | Nishino | A63B 37/0004 473/378 |
| 6,949,595 B2 | * | 9/2005 | Morgan | A63B 37/0003 473/374 |
| 7,244,384 B1 | * | 7/2007 | Dewanjee | A63B 45/00 156/146 |
| 2002/0022537 A1 | * | 2/2002 | Nesbitt | A63B 37/00 473/378 |
| 2006/0211516 A1 | * | 9/2006 | Hwang | A63B 37/0003 473/371 |
| 2010/0069173 A1 | * | 3/2010 | Okabe | A63B 37/0003 473/372 |
| 2012/0046129 A1 | * | 2/2012 | Matsuda | A63B 37/0003 473/378 |

\* cited by examiner

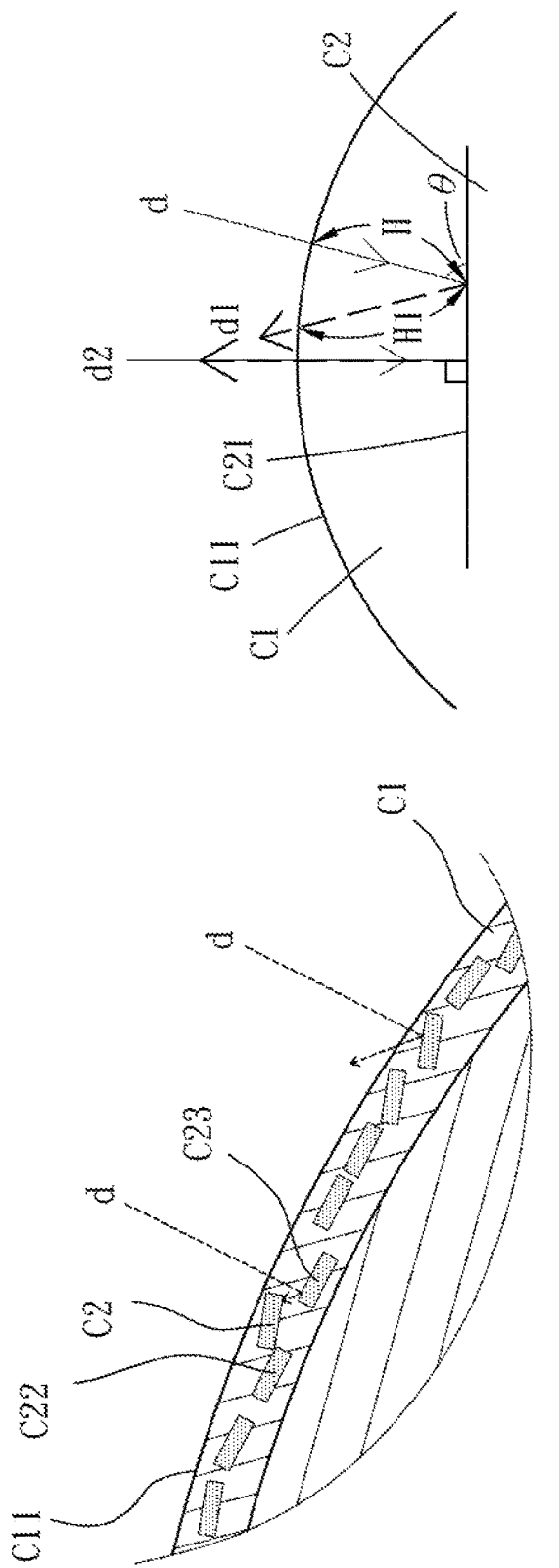

GOLF BALL FABRICATION METHOD

This is a continuation-in-part, and claims priority, from U.S. patent application Ser. No. 14/027,745 filed on Sep. 16, 2013, entitled "GOLF BALL" which is a continuation-in-part of U.S. patent application Ser. No. 12/535,312 filed on Aug. 4, 2009, entitled "GOLF BALL" which is also a continuation-in-part of U.S. patent application Ser. No. 11/529,526 filed on Sep. 29, 2006, entitled "GOLF BALL", the entire contents of which are hereby incorporated by reference.

This application claims the priority benefit of Application No. 2006-5465 filed in Japan on Jul. 7, 2006.

FIELD OF THE INVENTION

The present invention relates to a golf ball fabrication method, particularly to a fabrication method for a golf ball having a reflective effect and a long service life.

BACKGROUND OF THE INVENTION

Golf has become a popular sport in recent years rather than an expensive activity in the past. This becomes obvious as a great number of golf courses have been set up in a wide scope of areas. While the golf has become more popular and widespread nowadays, golf clubs and golf balls also become fashionable products on the market, and competition is fierce. How to develop products with distinguished features is vital to increase market share.

A conventional white golf ball A (referring to FIG. 1) has a ball body A1 with an opaque white layer A2 to facilitate view of the flight position. But the white layer A2 is deficient in reflection and becomes darker after subject to frequent hit of the golf clubs. This makes recognizing the distance and location of the white golf ball A after strike more difficult.

U.S. Pat. No. 6,949,595 B2 (referring to FIG. 2) discloses a multilayer golf ball B that has a core B1, a colored intermediate cover B2 outside the core B1, and a transparent cover B3 outside the intermediate cover B2. The colored intermediate cover B2 can be seen through the transparent cover B3. Moreover, the intermediate cover B2 can be formed in different colors during production to become more distinguishing and appealing. However, the color added to the golf ball B merely enhances the appeal, but does not help to view the flight location after being hitting. It fares even worse than the conventional while golf ball A in the second concern. Although luster-enhancing agent can be added to the intermediate cover B2 to make the color of the intermediate cover B2 brighter, it cannot help to improve reflection or view of the flight location.

Another U.S. Pat. No. 5,427,378 (referring to FIG. 3A) also discloses a golf ball C which mainly has an outer cover C1 randomly or fully embedded with reflective particles C2 to provide reflection (also referring to FIGS. 3B and 3C). While more reflective particles C2 distributed in the outer cover C1 can increase light reflective effect, more structural damages also incur to the outer cover C1. As a result, after the golf ball C is hit, the outer cover C1 is prone to crack, and the reflective particles C2 easily drop to result in diminishing the reflective effect and shortening the lifespan. Moreover, the reflective particles C2 are blended inside the outer cover C1 during production, thus the structure might like that depicted in FIG. 3C, i.e., some of the reflective particles C2 are tilted and overlapped, so that the reflective surfaces C21 of the reflective particles C2 could not parallel with the ball surface C11, such as the first reflective particle C2 and second reflective particle C22, or could generate gaps when being overlapped, such as the first reflective particle C2 and third reflective particle C23. In the second situation, when light d projects to the third reflective particle C23, it is refracted and blocked by the bottom of the first reflective particle C2, therefore the reflective effect is severely affected.

FIG. 3D illustrates another situation in which the light d enters to the reflective particle C2 non-vertically through the arched ball surface C11 at a first distance H and forms a non-vertical angle θ, and then another light d1 is reflected. As the light d1 is reflected through the ball surface C11 at a second distance H1 which is greater than the first distance H, the intensity of the light d1 is weaker, namely the vertical light d2 has better reflective effect than the non-vertical light d1. Thus, although the reflective particles C2 are proximate to the ball surface C11, as they are not parallel with the ball surface C11 at all, light reflection is adversely affected.

SUMMARY OF THE INVENTION

The present invention provides a golf ball fabrication method, which can fabricate in a simple way a golf ball having a superior reflective effect and a long service life simultaneously, and which improves the reflective effect of the reflective layer of the golf ball and enhances the durability of the reflective layer, whereby the reflective layer is less likely to be damaged, and whereby the cycles-to-failure of the reflective layer is increased, wherefore are overcome the problems of poor reflectiveness and low cycles-to-failure of the conventional golf ball.

To achieve the abovementioned objective, the present invention proposes a golf ball fabrication method, which comprises Step a: providing a core; Step b: spraying a thin resin film on the surface of the core to form a conductive layer; Step c: vacuum-electroplating the surface of the core to form a glossy thin metallic film functioning as a reflective layer; and Step d: encapsulating the glossy thin metallic film with a transparent resin layer in an injection-molding technology to form a transparent outer layer of the golf ball.

The golf ball fabrication method of the present invention can provide benefits as follows:

The method can fabricate a golf ball having a superior reflective effect and a long service life simultaneously in a simple way, making the reflective layer completely parallel the outermost transparent layer and generate the best reflective effect.

BRIEF DESCRIPTION OF THE DRAWINGS

FIG. 3C is a locally-enlarged sectional view according to FIG. 3A showing reflective particles distributed extensively;

FIG. 3D is a schematic view according to FIG. 3A showing light reflection when the light is incident vertically and non-vertically;

DETAILED DESCRIPTION OF THE PREFERRED EMBODIMENTS

Figure 2:
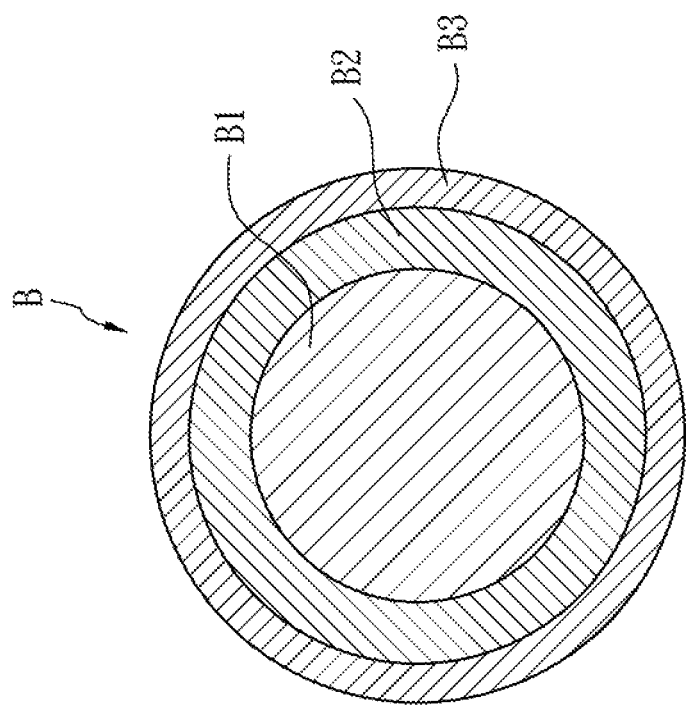
FIG. 2 is a sectional view of a golf ball disclosed in U.S. Pat. No. 6,949,595 B2.
Figure 1:
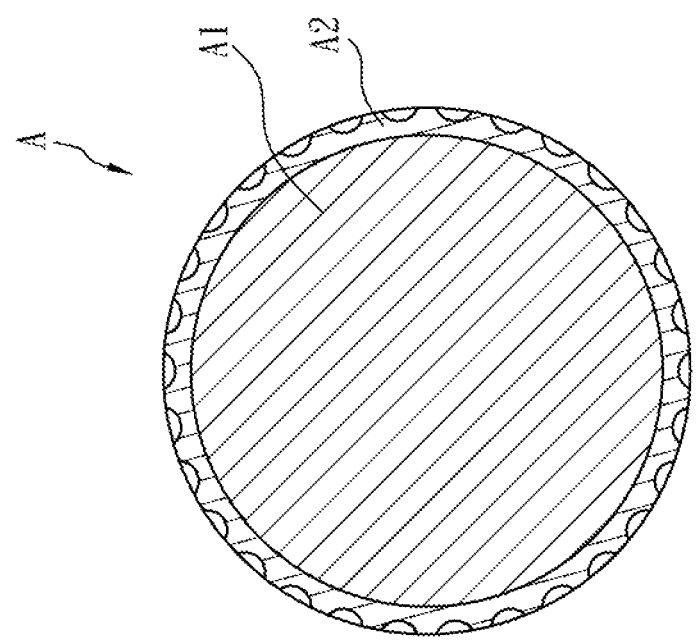
FIG. 1 is a sectional view of a conventional golf ball.
Figures 3A, 3B:
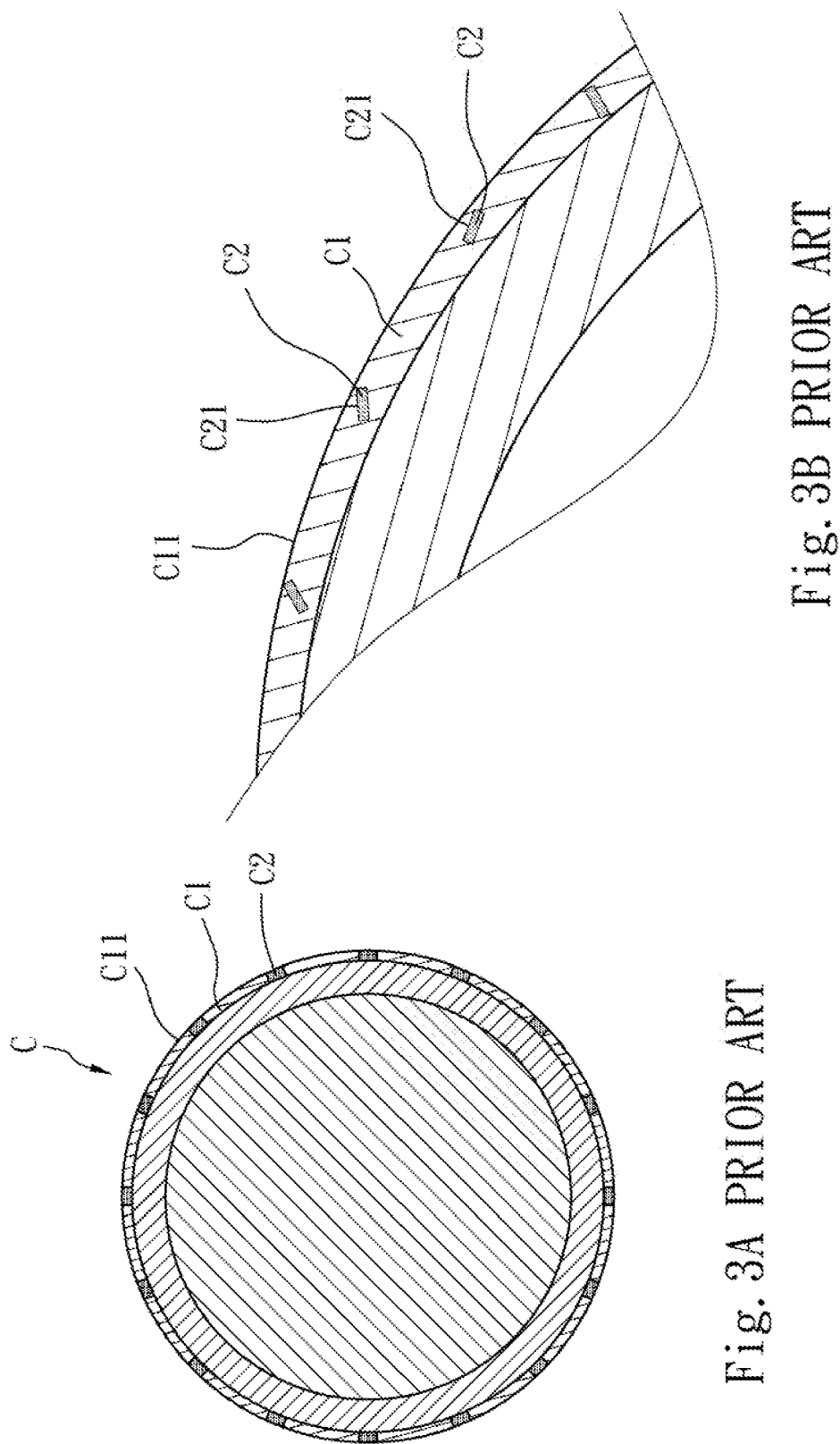
FIG. 3A is a sectional view of a golf ball disclosed in U.S. Pat. No. 5,427,378.
FIG. 3B is a locally-enlarged sectional view of FIG. 3A showing reflective particles distributed randomly.
Figure 4:
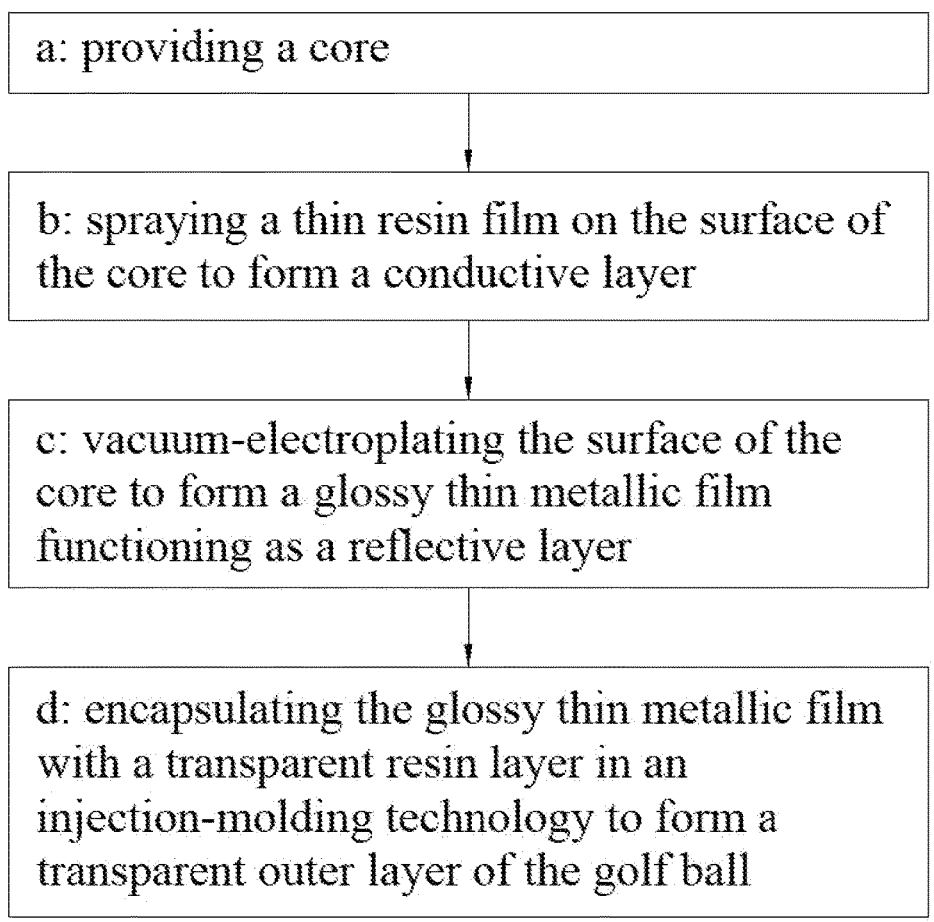
FIG. 4 is a flowchart of a golf ball fabrication method according to one embodiment of the present invention.
Figure 6:
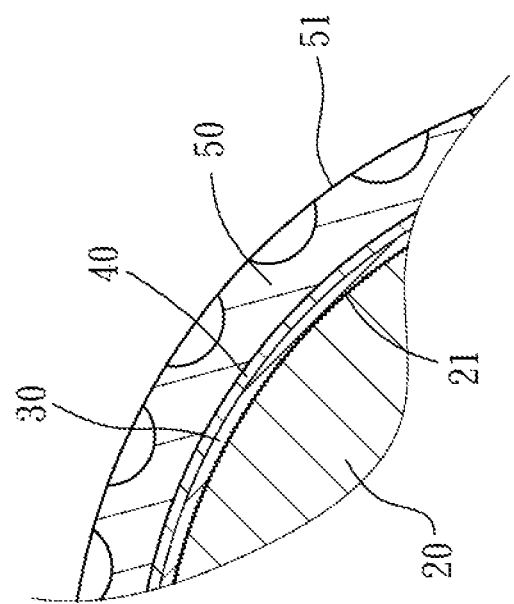
FIG. 6 is a locally-enlarged sectional view of a golf ball fabricated according to one embodiment of the present invention.
Figure 5:
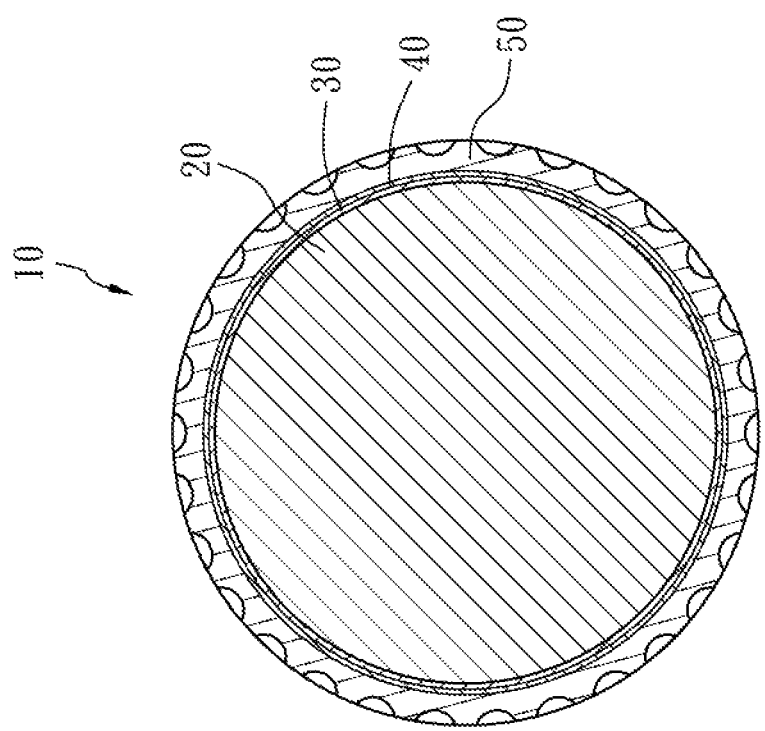
FIG. 5 is a sectional view schematically showing a golf ball fabricated according to one embodiment of the present invention.

Refer to FIGS. 4-6. The golf ball fabrication method of the present invention comprises Step a: providing a core 20;

Step b: spraying a thin resin film 30 on the surface of the core 20 to form a conductive layer;

Step c: vacuum-electroplating the surface of the core 20 to form a glossy thin metallic film 40 functioning as a reflective layer; and Step d: encapsulating the glossy thin metallic film 40 with a transparent resin layer 50 in an injection-molding technology to form a transparent outer layer of the golf ball 10.

Figure 7:
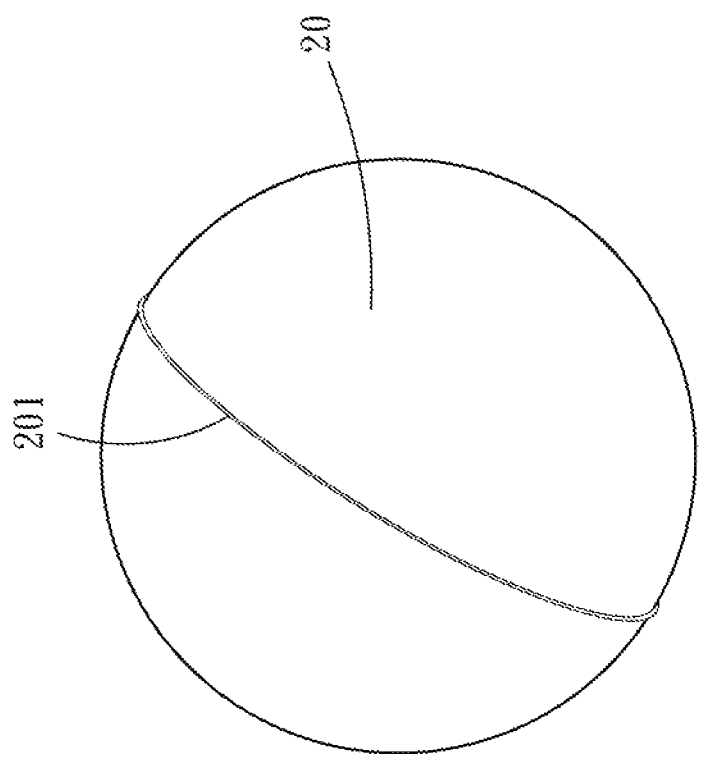
FIG. 7 is a perspective view schematically showing a parting line formed on a core of a golf ball fabricated according to one embodiment of the present invention.

Refer to FIGS. 4-6 again. In Step a, the core 20 is made of a mixture containing rubber or plastic. The core 20 is acquired from different sources according to the characteristics of the golf ball 10. In one embodiment, the core 20 is obtained via purchasing an existing product. In one embodiment, the core 20 is ground to have a finely-roughened surface 21. In one embodiment, the core 20 is fabricated in a high-temperature high-pressure compression molding method; after being demolded, the core 20 has a parting line 201 (as shown in FIG. 7); the parting line 201 is removed with a cutting tool; then the core 20 is ground to have a finely-roughened surface 21. In one embodiment, a release agent is attached to the inner surface of the high-temperature high-pressure molds to make the core 20 easily demolded from the molds; while the core 20 is ground to have a finely-roughened surface 21, the release agent is also ground away from the surface of the core 20.

In Step b, the thin resin film 30 is made of a PU (polyurethane) resin and coated on the finely-roughened surface 21 of the core 20. The smooth surface of the core 20 and the release agent attached to the high-temperature high-pressure molds beforehand are the factors impairing the bonding of the core 20 and the thin resin film 30. Since the two factors are removed in the present invention, the bonding of the core 20 and the thin resin film 30 is enhanced.

Figure 8:
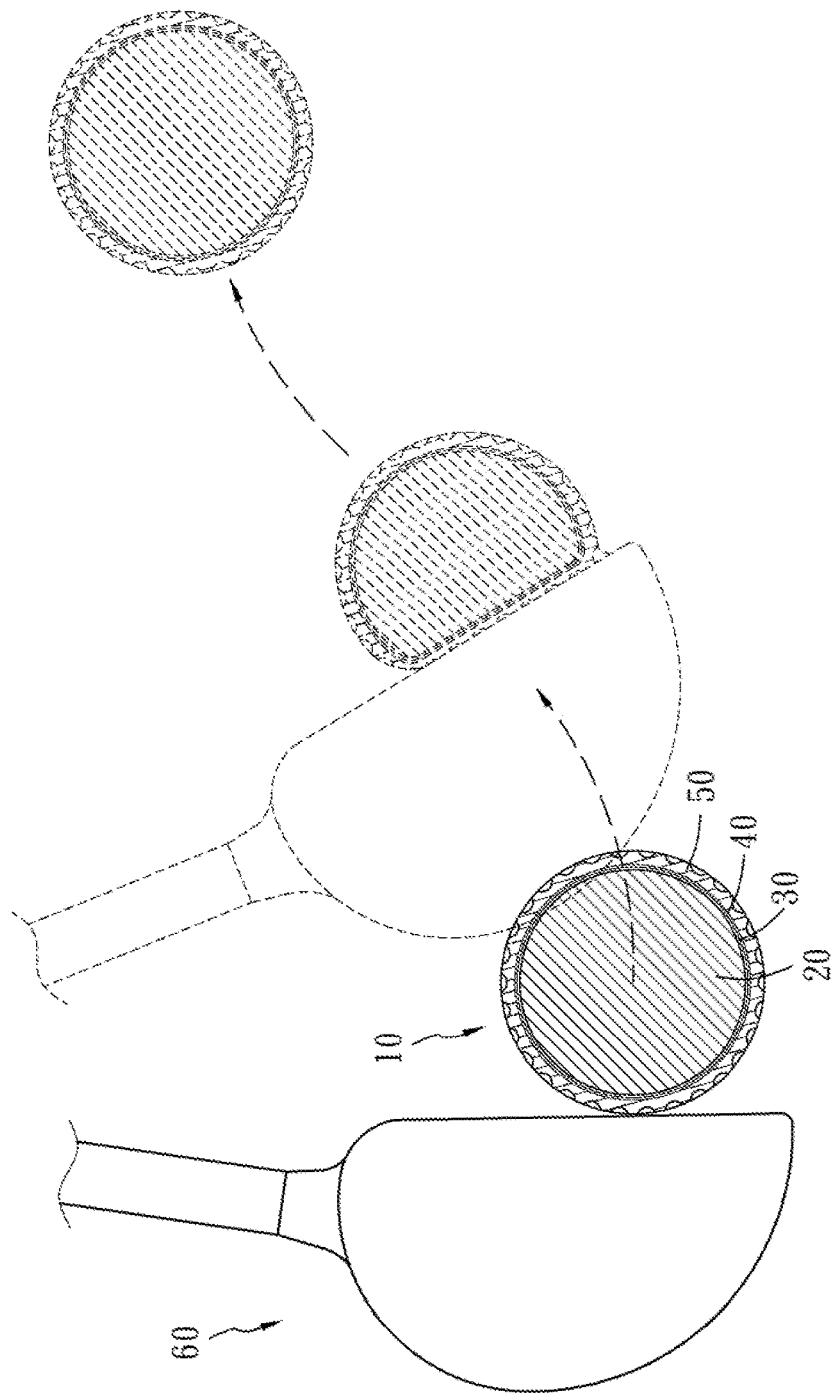
FIG. 8 is a diagram schematically showing a golf ball, which is fabricated according to one embodiment of the present invention and hit by a golf club.
Figure 10:
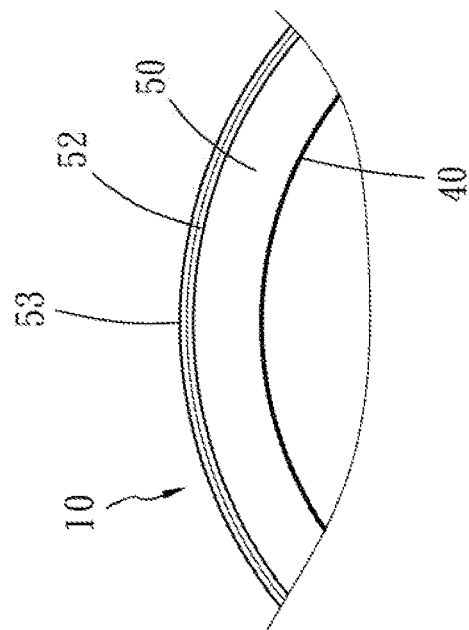
FIG. 10 is a diagram schematically showing that text or patterns are printed and then a thin transparent paint are sprayed on a finely-roughened surface of a golf ball fabricated according to one embodiment of the present invention.

In Step c, the glossy thin metallic film 40 is made of an aluminum alloy and vacuum-electroplated on the thin resin film 30. The glossy thin metallic film 40 cannot be directly vacuum-electroplated on the surface of the core 20. Therefore, the thin resin film 30 is sprayed on the surface of the core 20 to form a conductive layer. Thereby, the glossy thin metallic film 40 can be tightly bonded to the surface of the core 20. It is exactly the focus of the present invention: vacuum-electroplating the thin resin film 30 on the surface of the core 20 to make the glossy thin metallic film 40 tightly bonded to the surface of the core 20 and form a mirror-like reflective layer. While the golf ball 10 is hit, the tight bonding of the glossy thin metallic film 40 and the core 20 makes the glossy thin metallic film 40 less likely to peel off from the core 20. The glossy thin metallic film 40 should be very thin, limited to have a thickness of 1-30 μm. The glossy thin metallic film 40 is made of a metallic material. The glossy thin metallic film 40 having too large a thickness will make the golf ball 10 less likely to restore its original spherical shape after the golf ball 10 is hit by a golf club 60. In other words, the resilient force of the core 20 is hard to restore the deformed glossy thin metallic film 40 to its original shape after the golf ball 10 is hit by the golf club 60. Therefore, the glossy thin metallic film 40 must be very thin lest the golf ball 10 cannot be restored to its original spherical shape (as shown in FIG. 8).

In one embodiment, a sputtering technology replaces the vacuum-electroplating technology and is used to form the thin glossy thin metallic film 40 in Step c. In such a caser, spraying the thin resin film 30 on the surface of the core 20 (Step b) is unnecessary. The glossy thin metallic film 40 formed in the sputtering technology has a thickness of 0.3-5 μm.

Figure 9:
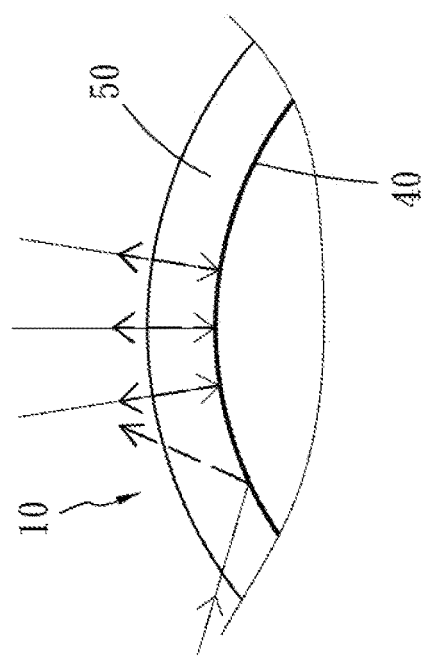
FIG. 9 is a diagram schematically showing that light is fully reflected by a golf ball fabricated according to one embodiment of the present invention.

In Step d, the transparent resin layer 50 is made of an artificial resin and encapsulates the glossy thin metallic film 40 in an injection-molding technology. The transparent resin layer 50 has an outermost surface 51 parallel to the continuous reflective surface of the glossy thin metallic film 40, whereby the transparent resin layer 50 can protect the continuous reflective surface of the glossy thin metallic film 40. Thus, no matter whether a light beam incident to the reflective layer vertically or non-vertically, the light beam can be fully reflected without obstruction (as shown in FIG. 9). Then, the reflective effect of the golf ball 10 can last longer. The transparent resin layer 50 can protect the glossy thin metallic film 40 from being damaged by hitting. While a light beam is incident to the glossy thin metallic film 40 through the transparent resin layer 50 and then reflected from the glossy thin metallic film 40 to the exterior through the transparent resin layer 50, the reflective effect is optimized. The glossy thin metallic film 40 is vacuum-electroplated on the thin resin film 30 and combined with the finely-roughened surface 21 of the core 20. The tight bonding of the glossy thin metallic film 40 and the core 20 makes the glossy thin metallic film 40 less likely to peel off from the hit golf ball 10. The transparent resin layer 50 also protects the glossy thin metallic film 40 from being fogged or damaged.

After the transparent resin layer 50 is formed in an injection-molding technology and demolded, the surface of the golf ball 10 has a parting line. The parting line is removed with a cutting tool or via grinding, and a thin transparent paint 53 is sprayed on the surface of the transparent resin layer 50 to form an outermost protection layer of the golf ball 10. In one embodiment, after the parting line 201 is removed, the transparent resin layer 50 is sandblasted to form a finely-roughened surface; text or patterns 52 are printed on the finely-roughened surface; then the thin transparent paint 53 is sprayed on the surface of the transparent resin layer 50 to form a protection layer (as shown in FIG.

10). In one embodiment, after the transparent resin layer 50 is sandblasted to form a finely-roughened surface, a thin ground-coat, which favors printing, is sprayed on the finely-roughened surface 21; then text or patterns 52 are printed on the thin ground-coat; finally the thin transparent paint 53 is sprayed on the surface to function as a protection layer.

Figure 11:
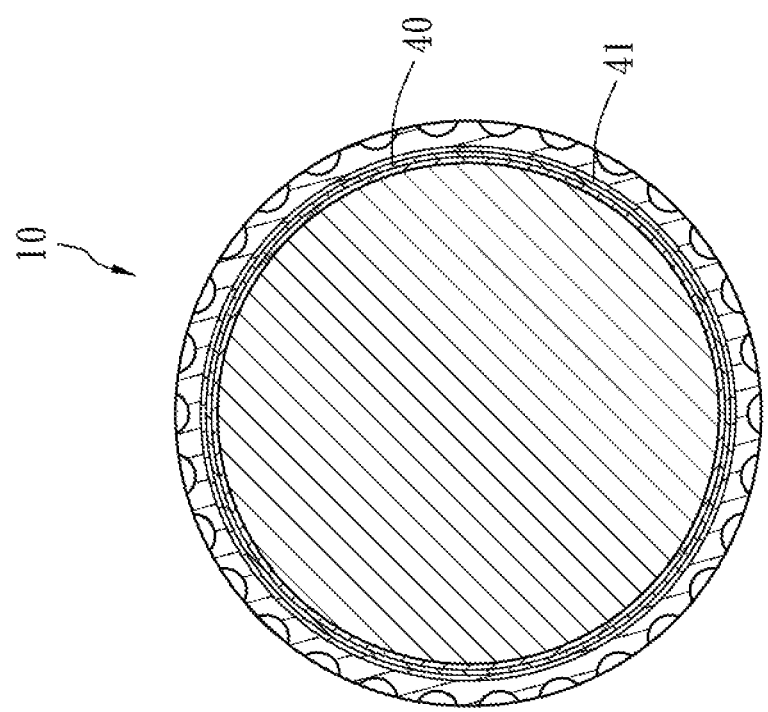
FIG. 11 is a sectional view schematically showing that a colored thin transparent resin film is sprayed on a glossy thin metallic film of a golf ball fabricated according to one embodiment of the present invention.
Figure 12:
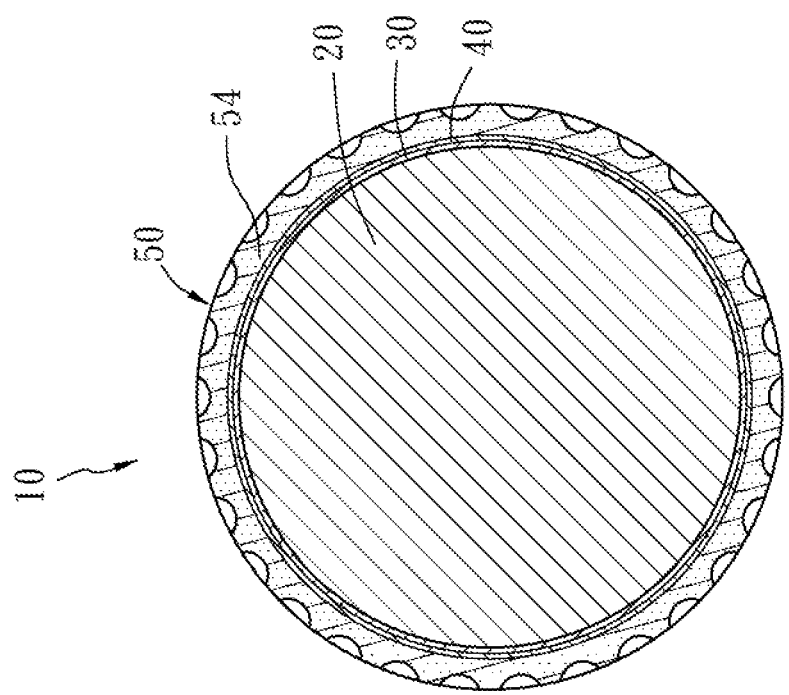
FIG. 12 is a sectional view schematically showing that fluorescent powder is distributed inside a transparent resin layer of a golf ball fabricated according to one embodiment of the present invention.

In one embodiment, after vacuum-electroplating is completed in Step c, a colored thin transparent resin film 41 is sprayed on the glossy thin metallic film 40, as shown in FIG. 11. Thus, the golf balls 10 may have different colors but can still reflect light.

In one embodiment, the glossy thin metallic film 40 is encapsulated with a colored transparent resin layer 50 in Step d. Thus, the golf balls 10 can reflect light beams of different colors. In one embodiment, the transparent resin layer 50 of the golf ball 10 contains fluorescent powder 54. While the golf ball 10 is flying, the glossy thin metallic film 40 and the fluorescent powder 54 of the outermost transparent resin layer 50 reflect light simultaneously and glisten together.

In summary, the present invention proposes a simple method to fabricate a golf ball 10, providing an optimized reflective function for the golf ball 10, protecting the glossy thin metallic film 40, bonding the glossy thin metallic film 40 to the core 20 tightly, exempting the glossy thin metallic film 40 from peeling off from the hit golf ball 10, protecting the glossy thin metallic film 40 from fogging and damage, and prolonging the service life of the golf ball 10.

What is claimed is:

1. A golf ball fabrication method comprising the steps of:
   Step a: providing a core, wherein the surface of the core is ground to form a roughened surface;
   Step b: spraying a thin resin film on a surface of the core to form a conductive layer;
   Step c: vacuum-electroplating the surface of the core to form a continuous thin metallic film functioning as a reflective layer, wherein the thin metallic film has a thickness of 1-30 μm; and
   Step d: encapsulating the thin metallic film with a transparent resin layer in an injection-molding technology to form a transparent outer layer of a golf ball, wherein the transparent resin layer directly contacts the thin metallic film.

2. The golf ball fabrication method according to claim 1, wherein in Step a, the core is made of a mixture containing rubber or plastic.

3. The golf ball fabrication method according to claim 1, wherein in Step a, the core is fabricated in a mold; after being demolded, the core has a parting line on the surface thereof; the parting line is removed with a cutting tool; then the core is ground to have a roughened surface.

4. The golf ball fabrication method according to claim 3, wherein a release agent is attached to an inner surface of the mold to make the core easily demolded; while the core is ground to have the roughened surface, the release agent is also ground away from the surface of the core.

5. The golf ball fabrication method according to claim 1, wherein in Step b, the thin resin film is made of a PU (polyurethane) resin.

6. The golf ball fabrication method according to claim 1, wherein in Step c, the thin metallic film is made of an aluminum alloy.

7. The golf ball fabrication method according to claim 1, wherein in Step d, the transparent resin layer is made of an artificial resin.

8. The golf ball fabrication method according to claim 1, wherein in Step d, after the transparent resin layer is formed in an injection-molding technology and demolded, the surface of the golf ball has a parting line; the parting line is removed with a cutting tool or via grinding; a thin transparent paint is sprayed on the surface of the transparent resin layer to form an outermost protection layer of the golf ball.

9. The golf ball fabrication method according to claim 8, wherein after the parting line is removed, the transparent resin layer is sandblasted to form a roughened surface, and text or patterns are printed on the roughened surface, and then the thin transparent paint is sprayed on the surface of the transparent resin layer to form a protection layer; alternatively, after the transparent resin layer is sandblasted to form a roughened surface, a thin ground-coat is sprayed on the roughened surface, and then text or patterns are printed on the thin ground-coat, and finally the thin transparent paint is sprayed on the thin ground-coat to function as a protection layer.

10. The golf ball fabrication method according to claim 1, wherein in Step c, after vacuum-electroplating is completed, a colored thin transparent resin film is sprayed on the thin metallic film.

11. The golf ball fabrication method according to claim 1, wherein in Step d, the transparent resin layer is colored.

12. The golf ball fabrication method according to claim 1, wherein in Step d, the transparent resin layer contains fluorescent powder.

* * * * *